(12) United States Patent
Verhaverbeke

(10) Patent No.: US 6,517,636 B1
(45) Date of Patent: Feb. 11, 2003

(54) METHOD FOR REDUCING PARTICLE CONTAMINATION DURING THE WET PROCESSING OF SEMICONDUCTOR SUBSTRATES

(75) Inventor: Steven Verhaverbeke, Radnor, PA (US)

(73) Assignee: CFMT, Inc., Wilmington, DE (US)

( * ) Notice: Subject to any disclaimer, the term of this patent is extended or adjusted under 35 U.S.C. 154(b) by 0 days.

(21) Appl. No.: 09/478,094

(22) Filed: Jan. 5, 2000

Related U.S. Application Data

(60) Provisional application No. 60/114,757, filed on Jan. 5, 1999.

(51) Int. Cl.[7] .................................................. C23G 1/00
(52) U.S. Cl. ..................... 134/2; 134/3; 134/6; 134/26; 134/28; 134/29; 134/34
(58) Field of Search ........................... 134/2, 6, 26, 29, 134/3, 28, 34

(56) References Cited

U.S. PATENT DOCUMENTS

| | | | |
|---|---|---|---|
| 4,577,650 A | 3/1986 | McConnell | 134/59 |
| 4,633,893 A | 1/1987 | McConnell et al. | 134/95 |
| 4,738,272 A | 4/1988 | McConnell | 134/59 |
| 4,740,249 A | 4/1988 | McConnell | 134/25.4 |
| 4,778,532 A | 10/1988 | McConnell et al. | 134/10 |
| 4,795,497 A | 1/1989 | McConnell et al. | 134/18 |
| 4,856,544 A | 8/1989 | McConnell | 134/95 |
| 4,899,767 A | 2/1990 | McConnell et al. | 134/56 R |
| 4,911,761 A | 3/1990 | McConnell et al. | 134/11 |
| 4,917,123 A | 4/1990 | McConnell et al. | 134/95 |
| 4,984,597 A | 1/1991 | McConnell et al. | 134/95 |
| 5,569,330 A | 10/1996 | Schild et al. | 134/1 |
| 5,571,337 A | 11/1996 | Mohindra et al. | 134/7 |
| 5,656,097 A | 8/1997 | Olesen et al. | 134/1 |

FOREIGN PATENT DOCUMENTS

EP          0 233 184          4/1992

OTHER PUBLICATIONS

Burkman et al., "Wet Chemical Processes–Aqueous Cleaning Processes", Handbook of Semiconductor Wafer Cleaning Technology, Kern, W. (Ed.), Noyes Publication, Parkridge, NJ, 1993, Chapter 3, 111–151.

Cahn, A. et al., "Surfactants and Detersive Systems," in Concise Encyclopedia of Chemical Technology, John Wiley & Sons, NY, 1985, 1142–1146.

(List continued on next page.)

Primary Examiner—Randy Gulakowski
Assistant Examiner—M. Kornakov
(74) Attorney, Agent, or Firm—Woodcock Washburn LLP

(57) ABSTRACT

The present invention provides methods of reducing particle contamination during wet processing of semiconductor substrates. In one embodiment of the present invention, a surfactant is added to any processing solution having a gas-liquid interface that the semiconductor substrates will be contacted with during immersion. The surfactant reduces the contact angle of the processing solution to less than 90° and inhibits deposition of particles onto the semiconductor substrates during immersion. In a preferred embodiment of the present invention, the semiconductor substrates are contacted with only one gas-liquid interface during wet processing that occurs during the immersion of the semiconductor substrates in an initial liquid processing solution. In this embodiment, the last processing solution in contact with the semiconductor substrates is removed by displacement with a drying fluid stream.

18 Claims, 6 Drawing Sheets

OTHER PUBLICATIONS

Horiki, H. et al., "Wet Etch Cleaning", in *Ultraclean Technology Handbook*, Ohmi, T. (ed.), Marcel Dekker, 1991, vol. 1, Ch. 3, 805–819.

Kern, W. et al., "Chemical Etching", *Thin Film Processes*, Vosser, J.L. (ed.), Academic Press, NY, 1978, vol. 1, pp. 403–447 and 452–481.

Kern, W. "Overview and Evolution of Semiconductor Wafer Contamination and Cleaning Technology", Handbook of Semiconductor Wafer Cleaning Technology, Kern, W. (Ed.), Noyes Publication, Parkridge, NJ, 1993, Chapter 1, 3–67.

Kezuka, T. et al., "The Behavior of Particles in Liquid Chemicals and Their Deposition Control onto Silicon Wafers," $17^{th}$ *Symposium on ULSI Cleaning Technology*, JA (NOKYO)—Hall, Tokyo, Japan Feb. 5–6, 1993, 144–158.

McCutcheon's Detergents and Emulsifiers, North American Edition, MC Publishing Company, Glen Rock, NJ, 1981.

Riley et al., "Investigating Liquid–Based Particle Deposition and The Effects of Double–Layer Interactions Using Hydrophobic Silicon Wafers," *Microcontamination*, 1990, 20–25 and 60.

Verhaverbeke, S. et al., "Scientific Rinsing and Drying on Macro and Microscale," in *Semiconductor Pure Water and Chemicals Conference 1996*, Balazs, M.K. (ed.), Santa Clara, CA Mar. 4–7, 1996, 14 pages.

METHOD FOR REDUCING PARTICLE CONTAMINATION DURING THE WET PROCESSING OF SEMICONDUCTOR SUBSTRATES

This Application: claims benefit of U.S. provisional Application Serial No. 60/114,757 filed Jan. 5, 1999.

FIELD OF THE INVENTION

This invention relates to methods for wet processing semiconductor substrates. More particularly, this invention relates to methods for reducing particle contamination of semiconductor substrates during wet processing.

BACKGROUND OF THE INVENTION

Wet processing of semiconductor substrates, such as wafers, flat panels, and other electronic component precursors is used extensively during the manufacture of integrated circuits. Preferably, wet processing is carried out to prepare the semiconductor substrates for processing steps such as diffusion, ion implantation, epitaxial growth, chemical vapor deposition, and hemispherical silicon grain growth, or combinations thereof. During wet processing, the semiconductor substrates are contacted with a series of processing solutions. The processing solutions may be used, for example, to etch, to remove photoresist, to clean, or to rinse the semiconductor substrates. See, e.g., U.S. Pat. Nos. 4,577,650; 4,740,249; 4,738,272; 4,856,544; 4,633,893; 4,778,532; 4,917,123; and EP 0 233 184, assigned to a common assignee, and Burkman et al., *Wet Chemical Processes-Aqueous Cleaning Processes*, pg 111–151 in Handbook of Semiconductor Wafer Cleaning Technology (edited by Werner Kern, Published by Noyes Publication Parkridge, N.J. 1993), the disclosures of which are herein incorporated by reference in their entirety.

There are various types of systems available for wet processing. For example, the semiconductor substrates may be processed in a single vessel system closed to the environment (such as a Full-Flow™ system supplied by CFMT Technologies), a single vessel system open to the environment, or a multiple open bath system (e.g., wet bench) having a plurality of baths open to the atmosphere.

Following processing, the semiconductor substrates are typically dried. Drying of the semiconductor substrates can be done using various methods, with the goal being to ensure that there is no contamination created during the drying process. Methods of drying include evaporation, centrifugal force in a spin-rinser-dryer, steam or chemical drying of wafers, including the method and apparatus disclosed in, for example, U.S. Pat. No. 4,778,532.

A frequent problem encountered during wet processing is contamination of the semiconductor substrates with particles made of materials such as $Si_3N_4$, Si, $SiO_2$, resist residue, hair, linen, dust, dirt and other solid contaminants. Particle contamination of the semiconductor substrates is undesirable as it can cause device defects in the semiconductor substrates, reducing overall manufacturing yields. Thus, much effort has focused on understanding the mechanism of particle deposition onto semiconductor substrates during wet processing so that it can be minimized.

Particles are deposited onto semiconductor substrates during wet processing through various mechanisms. For example, an article by Riley et al., entitled *Investigating Liquid-Based Particle Deposition and The Effects of Double-Layer Interactions Using Hydrophobic Silicon Wafers*, Microcontamination, December 1990, p. 20–24, discloses that the primary mechanism of particle deposition onto a silicon wafer immersed in a liquid is effected by the interaction of the particle with the wafer surface. For example, negatively charged particles were found to primarily deposit onto a negatively charged wafer during withdrawal of the wafer through the gas-liquid interface of the solution. In this case, the negatively charged particles were deposited onto the wafer via a thin film of liquid that covers the wafer on withdrawal. In contrast, for positively charged particles, the majority of particles deposited on the negatively charged wafer surface while the wafer was fully immersed in the solution via a bulk deposition mechanism. Thus, in the case of positively charged particles, it was recommended to minimize wafer contact time in the bath, and for negatively charged particles, an additional rinsing step was recommended to remove particles adhering to the surfaces of the wafers after removal of the wafers from the solutions.

Further studies have been conducted related to particle deposition mechanisms resulting in alternative solutions. For example, in an article by T. Kezuka, et al., entitled *The Behavior of Particles in Liquid Chemicals and Their Deposition Control onto Silicon Wafers*, $17^{th}$ Symposium on ULSI Cleaning Technology, Feb. 5 to Feb. 6, 1993, JA (NOKYO)-Hall, Tokyo, Japan ("Kezuka"), it was reported that certain surfactants could be added to a hydrofluoric acid containing solution to prevent polystyrene latex particles from being deposited onto the silicon wafers while the silicon wafers were fully immersed in the hydrofluoric acid containing solution. Anionic surfactants were found to be particularly useful in preventing bulk deposition of polystyrene latex particles onto silicon wafers. This effect was hypothesized to be impart due to the zeta potentials of the particles and silicon wafer surfaces.

U.S. Pat. No. 5,656,097 to Olesen et. al., (hereinafter "Olesen") discloses an alternative solution for reducing particle contamination during wet processing. In Olesen, semiconductor wafers are processed in an open vessel in a particular sequence of cycles. The method includes filling the vessel with one or more dilute cleaning solutions, completely "dumping" the cleaning solutions after cleaning, and rinsing the wafers after one or more of the cleanings by filling the tank with rinsing water and spraying the walls of the tank and wafers with the rinsing water while the tank is being filled. Megasonics are also used in certain cycles to inhibit particle deposition. Olesen discloses that low concentrations of surfactants may be used in the cleaning solutions.

Despite these proposed solutions for reducing particle contamination during wet processing, particle contamination is still a problem that can be further improved. The present invention seeks to provide other methods of reducing particle contamination during wet processing. Particularly, it has been found that contact of semiconductor substrates with a gas-liquid interface during wet processing can be a significant source of particle contamination. This particle contamination is especially problematic when contacting the semiconductor substrates with a gas-liquid interface during immersion in a processing solution (including a rinsing solution).

One possible solution is to minimize the exposure of the semiconductor substrates to gas-liquid interfaces during wet processing. However, in traditional multiple open bath systems (e.g., wet bench systems), where the semiconductor substrates are moved in and out of numerous baths containing processing solutions, the semiconductor substrates must be exposed to multiple gas-liquid interfaces.

Single vessel systems, if designed appropriately, can eliminate the exposure to multiple gas-liquid interfaces encountered in multiple open bath systems. However, even in a single vessel system, the semiconductor substrates must still be exposed to at least one gas-liquid interface (usually when the vessel is initially filled). This initial gas-liquid interface that the semiconductor substrates are exposed to can cause particle contamination that is difficult to remove in subsequent processing steps.

The present invention provides methods for reducing particle contamination in both single vessel and multiple bath systems where the semiconductor substrates are exposed to at least one gas-liquid interface during immersion. Particularly, the methods of the present invention reduce particle contamination during the wet processing by including, among other features, the use of a surfactant when the semiconductor wafers are contacted with gas-liquid interfaces during immersion.

SUMMARY OF THE INVENTION

The present invention provides methods for reducing particle contamination of semiconductor substrates during wet processing. In one embodiment, the method includes initially immersing and contacting the semiconductor substrates with an initial liquid processing solution having a first gas-liquid interface and containing at least one first surfactant, where the semiconductor substrates are contacted with the first gas-liquid interface during the initial immersing; and immersing and contacting the semiconductor substrates with one or more subsequent processing solutions, wherein all the subsequent processing solutions that have a gas-liquid interface that the semiconductor substrates are contacted with during the immersing further has at least one second surfactant that provides an immersion contact angle of less than 90°.

In a preferred embodiment of the present invention, the method includes immersing the semiconductor substrates in an initial processing solution containing at least one surfactant, wherein the semiconductor substrates are contacted with an initial gas-liquid interface during the immersing; contacting the semiconductor substrates with one or more processing solutions to process the semiconductor substrates, where during the processing, the semiconductor substrates are exposed to no gas-liquid interfaces, except for the initial gas-liquid interface of the initial processing solution; and removing the last processing solution by displacing the last processing solution with a drying fluid stream.

DETAILED DESCRIPTION OF THE INVENTION

The present invention provides methods for reducing particle contamination of semiconductor substrates during wet processing. The methods of the present invention are particularly useful for reducing particle contamination of semiconductor substrates during immersion of the semiconductor substrate into a gas-liquid interface. It has been found that the inclusion of a surfactant into a liquid processing solution having a gas-liquid interface that the semiconductor substrate will be contacted with during immersion reduces particle contamination of the semiconductor substrate during wet processing.

Although not intending to be limited by theory, it is believed that particles tend to lie at gas-liquid interfaces and that these particles can be undesirably deposited on a semiconductor substrate during immersion of the semiconductor substrate into a liquid processing solution. It has been found that particle deposition during immersion is enhanced when the liquid is non-wetting (contact angle equal to or greater than about 90°) relative to the semiconductor substrate. A wetting surfactant is added, in accordance with the present invention, to convert the liquid from being non-wetting to wetting (i. e., contact angle less than about 90°) under both static and dynamic conditions and, therefore, reduce particle contamination. This is further explained below.

Figure 1:
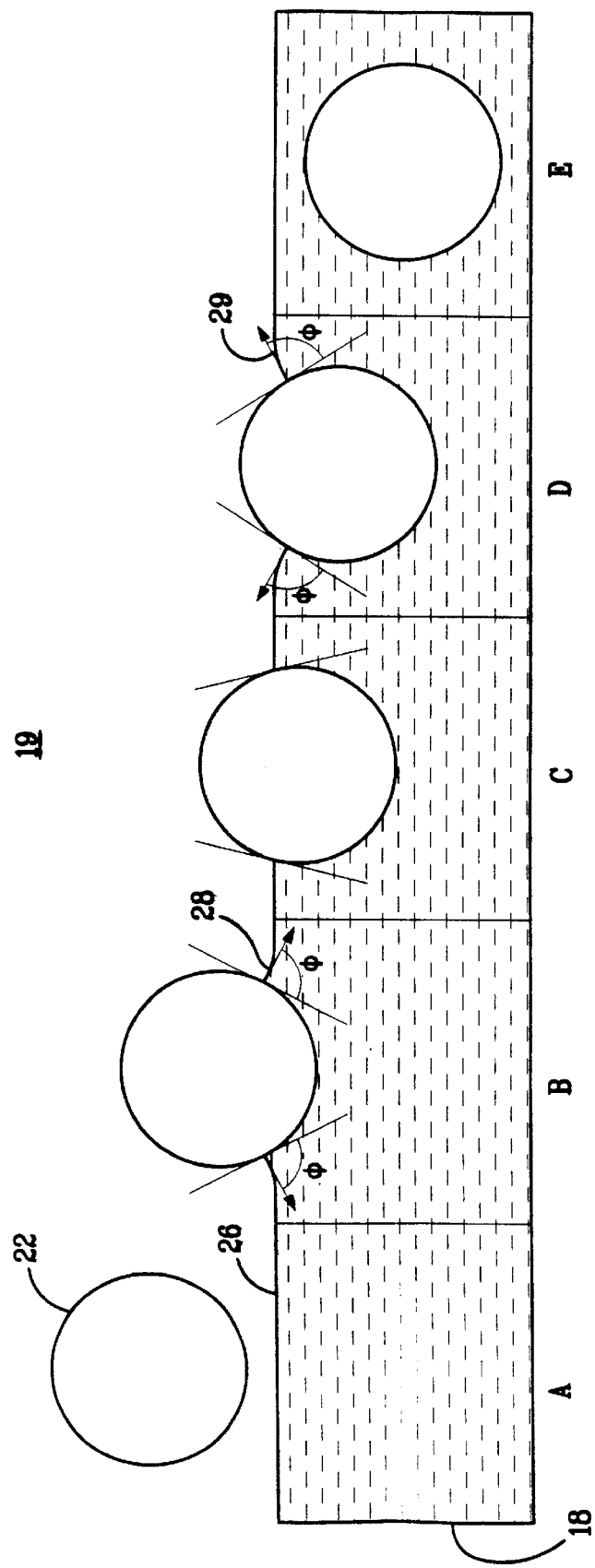
FIG. 1 is a schematic representation showing the tendency of particles to lie at gas-liquid interfaces.

The tendency for particles to lie at gas-liquid interfaces is schematically shown in FIG. 1. Referring to the Figures where like reference numerals refer to like element, FIG. 1 shows a particle 22 located in several positions (A to E) relative to a liquid 18, a gas 19, and a gas-liquid interface 26. In positions B, C, and D, particle 22 is located at the gas-liquid interface 26. In position B, surface tension forces 28 draw particle 22 further into the gas-liquid interface 26 to reach position C. At position C, the surface tension forces are balanced (i.e., minimal free energy) so that there is no driving force for particle 22 to either exit the liquid 18 or to become further immersed in the liquid 18. In position D, surface tension forces 29 tend to pull the particle further out of the liquid to reach position C so that again free energy of the surfaces (particle and gas-liquid interface) are minimized. In positions A and E, particle 22 is located completely in the gas 19 and liquid 18 respectively. In both positions A and E, particle 22 can come in contact with the gas-liquid interface 26 through random motion. Once particle 22 comes in contact with the gas-liquid interface 26, it becomes "caught" through the interaction of the surface tension forces 28, 29 shown in positions B and D respectively to pull the particle to position C where free energy of the surfaces is minimized.

Figure 2:
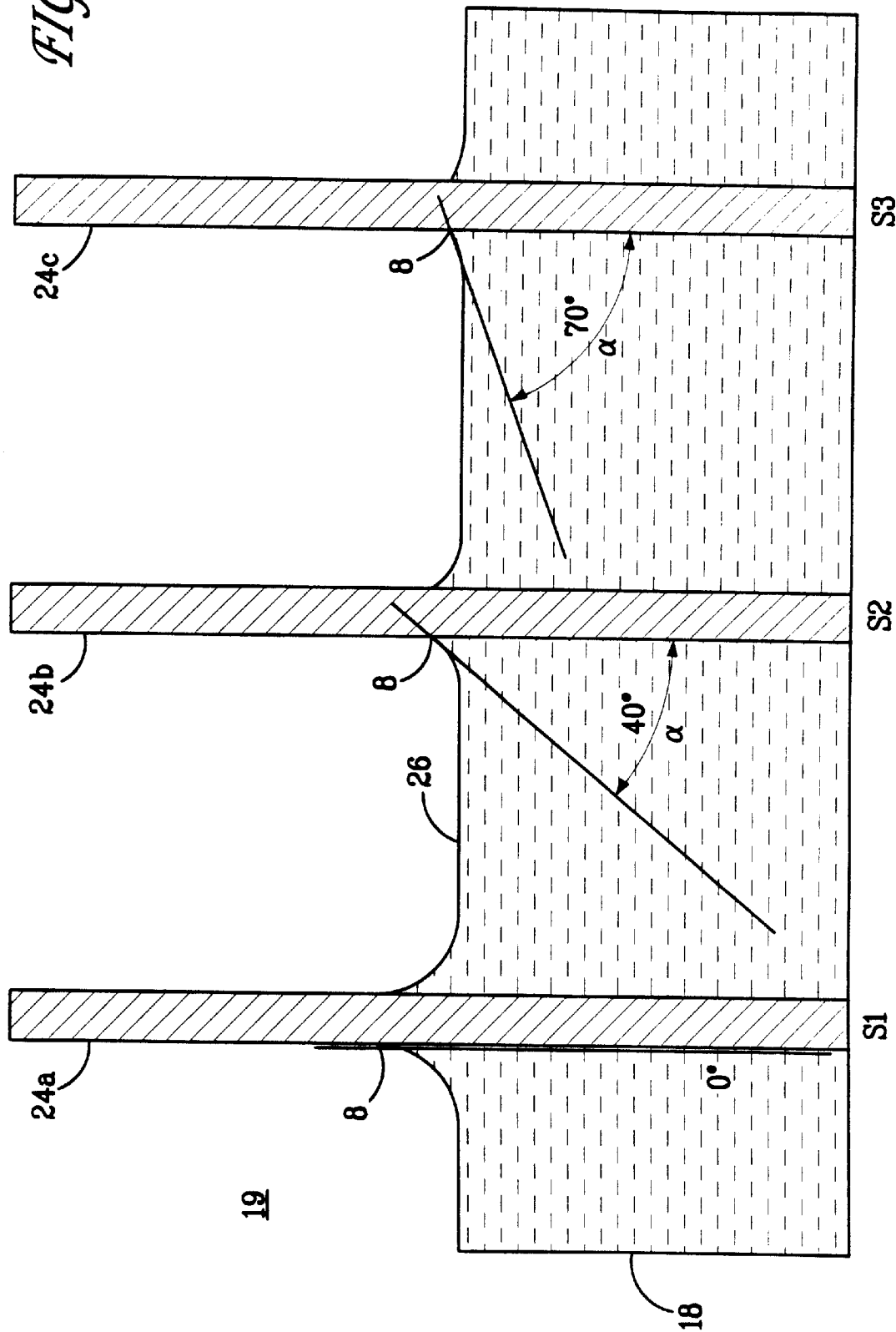
FIG. 2 is a drawing showing the contact angle between a gas, liquid and three semiconductor substrates having different surfaces.

Whether particles will be deposited onto a substrate during immersion through a gas-liquid interface can be predicted in part by the angle between the gas-liquid interface and the semiconductor substrate. This angle, hereinafter referred to as a "contact angle," is shown in FIG. 2 in a static system (not moving) for three semiconductor substrates S1, S2, and S3 having different surfaces 24A, 24B, and 24C that are partly in contact with a liquid 18 and a gas 19. The contact angle α is shown as the angle between the substrate surface 24A, 24B, 24C and a line 8 that is tangent to the gas-liquid interface 26 at the substrate surface 24A, 24B, 24C. Generally, if a contact angle α is less than 90°, the liquid is said to be "wetting" which indicates the liquid is "attracted" to the substrate. If the contact angle α is greater than 90° the liquid is said to be "non-wetting" which indicates the liquid and substrate "repel" each other. Under static conditions in FIG. 2, the liquid is wetting with respect to all three semiconductor substrates S1, S2, S3. This is the most common situation for a semiconductor substrate immersed in water under static conditions.

Figure 3B:
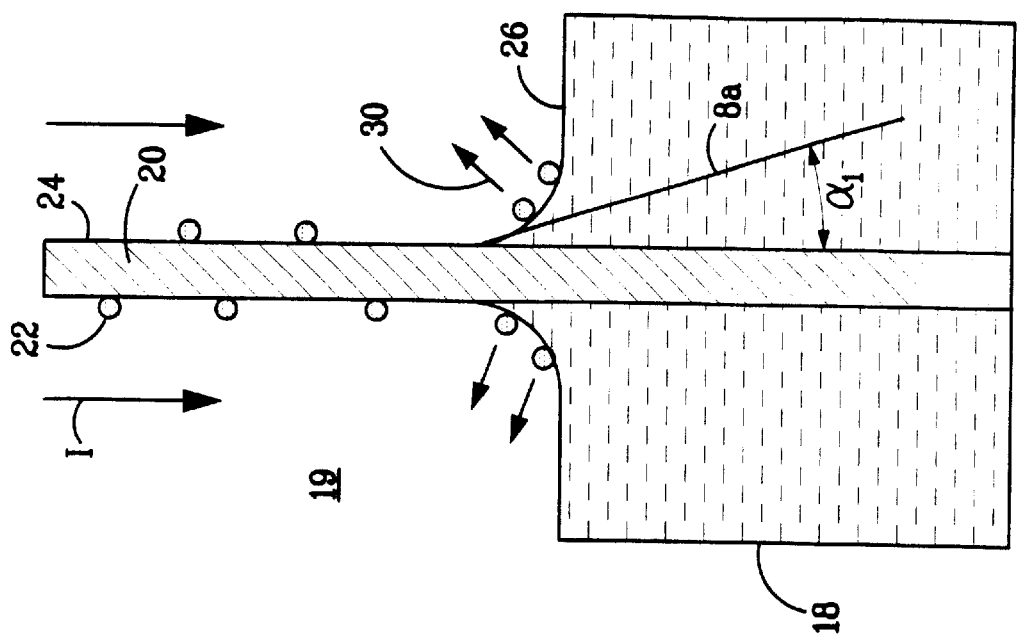
FIG. 3B is a schematic drawing showing the removal of particles onto a semiconductor substrate during immersion.
Figure 3A:
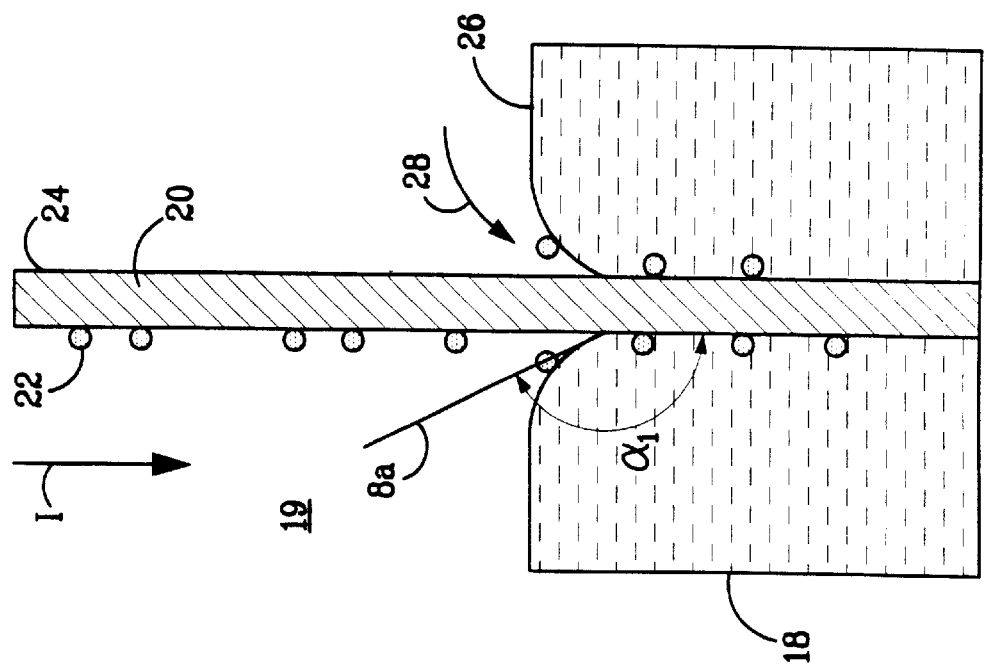
FIG. 3A is a schematic drawing showing the deposition of particles onto a semiconductor substrate during immersion.

The relation of contact angle to particle deposition during immersion of a semiconductor substrate is shown in FIG. 3A. FIG. 3A shows a semiconductor substrate 20 being immersed into liquid 18 from gas atmosphere 19. The substrate 20 is shown as having particles 22 located on substrate surface 24. The liquid 18 also has particles 22 located at the gas-liquid interface 26. As the substrate is immersed into the liquid in a direction I, the contact angle $\alpha_1$ formed between tangent line 8a and substrate surface 24 is greater than 90° (i.e., nonwetting) causing the particles 22 at the gas-liquid interface 26 to be plied towards the substrate surface 24 in the direction shown by arrows 28.

In contrast, FIG. 3B shows a model for particle removal during immersion of a semiconductor wafer 20 into a liquid 18. In this model, the contact angle $\alpha_1$, during immersion is less than 90°, causing the particles 22 at the gas-liquid interface 26 and on substrate surface 24 to be directed away from the wafer surface 24 in the direction of arrows 30. Thus, it is believed that through altering the contact angle to less than 90° during immersion, particle contamination of semiconductor substrates can be reduced during wet processing.

The contact angle α is affected by the surface tension (i.e., attraction) between the substrate surface and the liquid, and the surface tension between the substrate surface and the gas. Additionally, the contact angle is affected by movement, for example the motion of the liquid or semiconductor substrate during immersion or withdrawal.

For example, referring back to FIG. 2, semiconductor substrate S1 has a hydrophilic surface 24A that is greatly attracted to liquid 18. In this case, the attraction results in a contact angle α that approaches 0°. Such a hydrophilic surface 24A could be produced for example from cleaning with an SC1 solution. Semiconductor substrate S2 has a less hydrophilic surface 24B (e.g., coated with thermal oxide) resulting in the liquid 18 and semiconductor substrate S2 being less attracted. This decrease in attraction results in the contact angle increasing to around 40°. Semiconductor substrate S3 has a hydrophobic surface 24C formed for example through etching to produce a bare Si surface. Surface 24C is the least attracted to liquid 18, resulting in a contact angle of around 70°.

Figure 4:
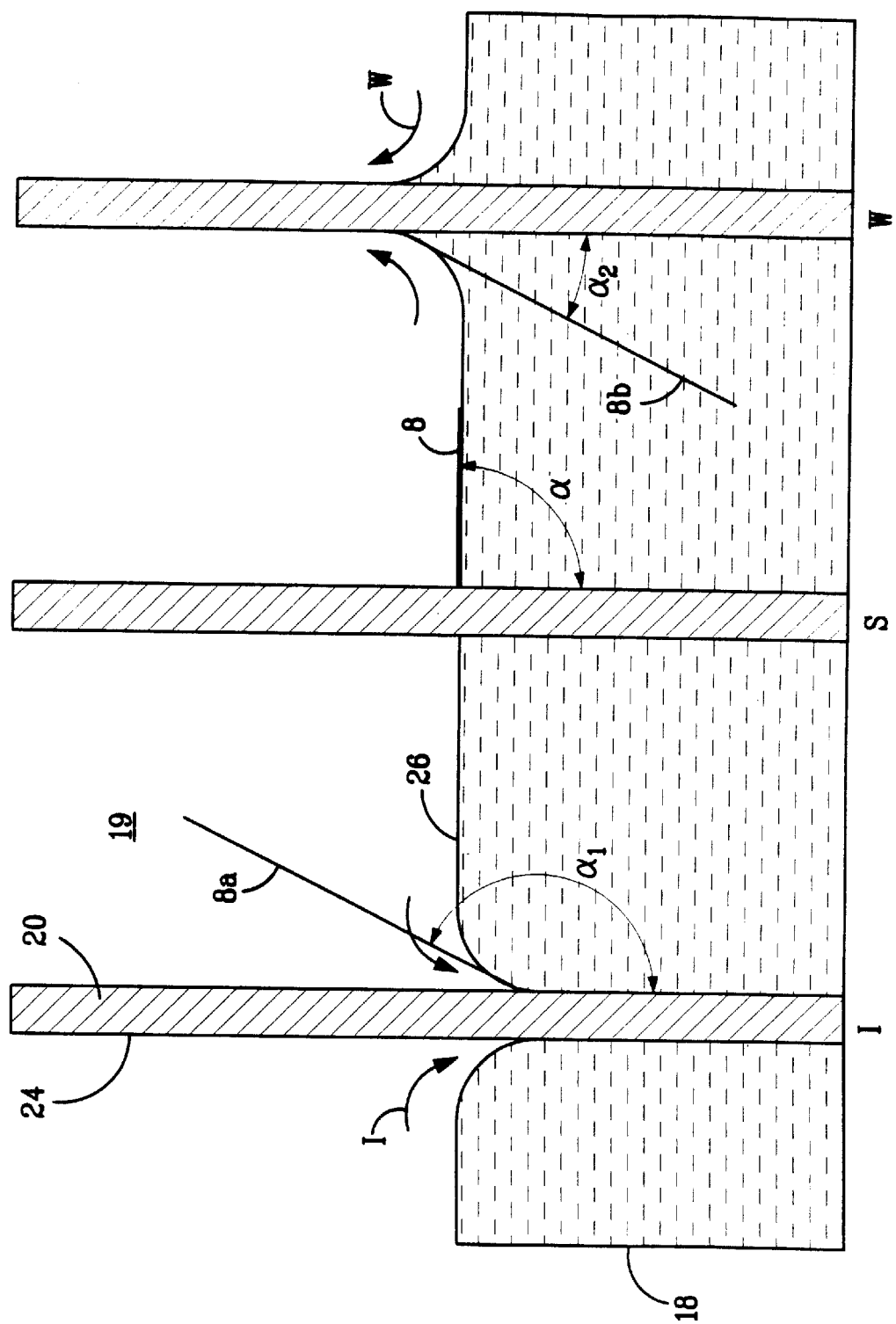
FIG. 4 is a schematic drawing showing how immersion and withdrawal of a semiconductor substrate can effect the contact angle.

The contact angle can undesirably change to promote particle deposition in a dynamic system, such as when immersing or withdrawing a semiconductor substrate into or from a liquid. FIG. 4 shows how movement of either the liquid or substrate can alter contact angle α. In FIG. 4, a semiconductor substrate 20 is shown being immersed (I), remaining static (S), and being withdrawn (W). Under static conditions (S), the contact angle α is equal to 90°. However, during immersion, the contact angle $\alpha_1$ increases to much greater than 90° as shown by the angle formed between tangent line 8a and the substrate surface 24. During withdrawal, the contact angle $\alpha_2$ decreases to less than 90° as seen by the angle formed between tangent line 8b and the substrate surface 24.

Figure 5A:
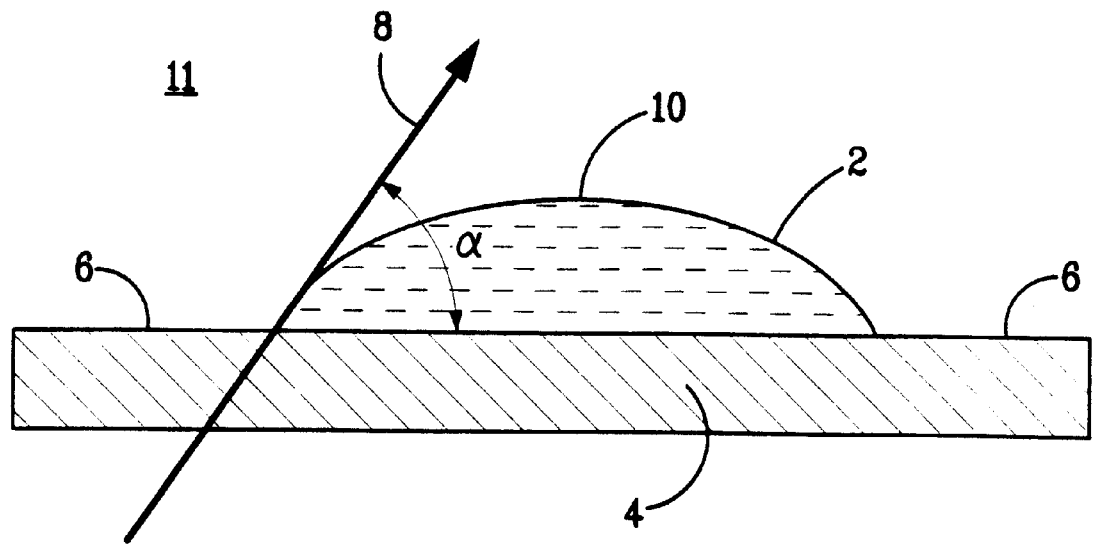
FIG. 5A is a drawing showing the contact angle for a liquid drop on a solid substrate in a static system.
Figure 5B:
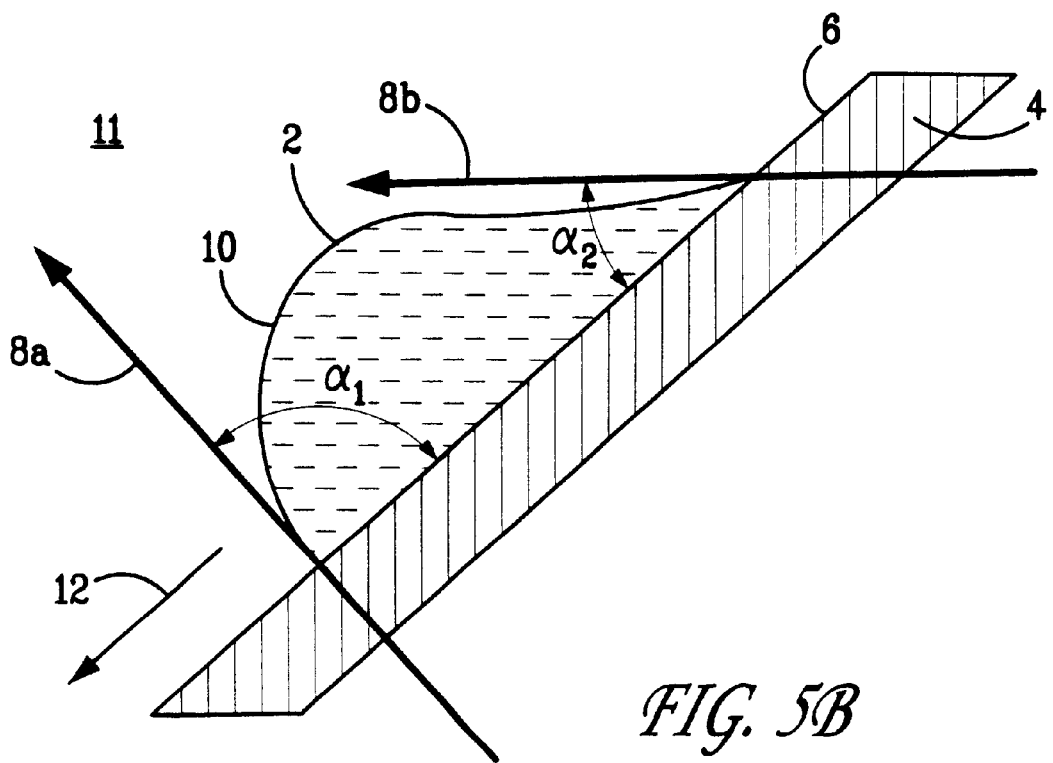
FIG. 5B is a drawing showing the contact angle for a liquid drop on a solid substrate in a dynamic system.

This change in contact angle during immersion and withdrawal can be approximated from the contact angles formed by a moving drop of liquid on a semiconductor substrate exposed to a gas atmosphere 11. For example, FIGS. 5A and 5B show static contact angle α and dynamic contact angles $\alpha_1$, $\alpha_2$, respectively, for a drop of liquid 2 located on surface 6 of substrate 4. The static contact angle α is shown in FIG. 5A as the angle between substrate surface 6 and line 8 that is tangent to the gas-liquid interface 10 at substrate surface 6. Dynamic contact angles are shown in FIG. 5B for the same liquid drop 2 moving in the direction of line 12. There are two dynamic contact angles for liquid drop 2: an advancing angle $\alpha_1$ formed between tangent line 8a and substrate surface 6, and a receding angle $\alpha_2$ formed between tangent line 8b and substrate surface 6. The advancing angle $\alpha_1$ approximates the contact angle observed during immersion of a semiconductor substrate into a liquid (i.e., the immersion contact angle), and the receding angle $\alpha_2$ approximates the contact angle observed during withdrawal of the semiconductor substrate from the liquid. As can be seen in FIGS. 5A and 5B, advancing angle $\alpha_1$ is always greater than the static contact angle α and the receding contact angle $\alpha_2$. Also, the receding contact angle $\alpha_2$ tends to be less than the static contact angle α. In many cases the advancing contact angle $\alpha_1$ will far exceed the static contact angle α, easily pushing the contact angle over 90°, changing the interaction of the liquid with the solid from being wetting to non-wetting. For example, in FIG. 2, semiconductor substrates S2 and S3 could easily form contact angles with the gas-liquid interface 26 of greater than 90° during immersion. Thus, the contact angle needs to be reduced to less than 90° for both static and dynamic conditions to reduce particle contamination of the semiconductor substrate during immersion.

One way to reduce the contact angle during immersion is to add a surfactant to the solution. For example, when surfactants are in a solution, they collect at various surfaces such as the solution surface, immersed substrate surface, and particle surface reducing the free energy of the surfaces. As a result, the surfactant will lower the static contact angle of a solution to below 90°. Under normal immersion conditions, the dynamic contact angle will not be significantly increased in the presence of a surfactant, resulting in a "wetting" solid-liquid interface even under dynamic conditions.

The presence of a surfactant also has other benefits for reducing particle deposition or adhesion onto a semiconductor substrate. For example, a surfactant will collect at the surface of a liquid, thereby displacing any particles from the liquid surface. Minimizing the amount of particles at the liquid surface reduces the likelihood of a particle at the liquid surface coming into contact with a solid surface such as a semiconductor substrate. Also, the surfactant provides an electrochemical barrier to prevent further particulate adhesion. For example, the surfactant will gather at a liquid surface, a solid surface or any other surface that will help to lower its overall energy, including particles and semiconductor substrates. Since the semiconductor substrate and particles are surrounded on all sides by surfactant, the overall charge of the particle/surfactant and semiconductor substrate/surfactant may be approximated as the charge of the surfactant. Since the particles and semiconductor substrate have the same charge of the surfactant, they will not be attracted to each other as opposite charges are, thereby preventing additional particle adhesion during immersion.

Thus, in the methods of the present invention, a semiconductor substrate, such as for example a wafer, flat panel, or other electronic component precursor, is immersed and contacted with one or more processing solutions, where the processing solutions that have a gas-liquid interface that the substrates are contacted with during the immersing further comprises a surfactant. The initial processing solution that the semiconductor substrates are exposed to will have a gas-liquid interface that the semiconductor substrates are contacted with during immersion. Subsequent processing solutions that the semiconductor substrates are immersed in may or may not have gas-liquid interfaces that the semiconductor substrates are exposed to depending on the method of wet processing employed.

By "immersion" it is meant that the semiconductor substrate is introduced into a processing solution by any means. For example, the semiconductor substrate may be placed (e.g., lowered, raised, etc.) in a processing solution. Also for example, the semiconductor substrate may be placed in a vessel and the vessel may be filled with processing solution. By "gas-liquid interface" it is meant any boundary between a gas phase and a liquid phase such as for example an air-liquid processing solution interface. The "gas phase" of the "gas-liquid interface" is noncondensible at the temperatures of use, as opposed to a condensible vapor such as isopropanol at its boiling point.

The methods of the present invention are useful in any wet processing procedure for semiconductor substrates where the semiconductor substrates are exposed to one or more gas-liquid interfaces. By "wet processing" it is meant that the semiconductor substrates are contacted with one or more processing solutions to process the semiconductor substrate in a desired manner. Typically, such wet processing is carried out to prepare the semiconductor substrate for processing steps such as diffusion, ion implantation, epitaxial growth, chemical vapor deposition, and hemispherical silicon grain growth, or combinations thereof.

By "processing solution" it is meant any solution (e.g., liquid, vapor, or gas) used to treat, rinse, or dry a semiconductor substrate. "Treating" solutions are preferably chemically reactive solutions that remove unwanted materials from the surfaces of the semiconductor substrates. For example, it may be desired to clean the semiconductor substrates to remove particles, or organics such as waxes, residual polish, or grease. It may also be desired to etch the semiconductor substrate surface to remove, for example unwanted oxides. Further, it may be desired to remove photoresist or ashed photoresist. "Rinsing solutions" are preferably non-chemically reactive solutions used to remove residual treating solution or particles from the surfaces of the substrates. "Drying solutions" are preferably used to dry the semiconductor substrates such that the substrates are preferably substantially free of liquid droplets. However, the drying solutions may also be used to simply displace or remove a treating or rinsing solutions. The aforementioned wet processing steps are provided as examples only of possible wet processing steps that the methods of the present invention are useful for. One skilled in the art would recognize that the methods of the present invention may be applied to other types of wet processing steps where a semiconductor substrate is exposed to a gas liquid interface.

The surfactant useful in the present invention may be any compound that reduces the contact angle between the gas, liquid, and semiconductor substrate to less than 90°. Typically, the surfactant will have one or more hydrophobic portions and one or more hydrophilic portions for facilitating wetting and reducing the contact angle to less than 90°.

Preferably, the surfactant chosen lowers the contact angle to less than 50°, more preferably less than 10°, and most preferably to less than 5°, or as close to 0° as possible. By "contact angle" it is meant either a static or dynamic contact angle as shown in the Figures unless the contact angle is specifically designated as static or dynamic. The surfactant is also preferably compatible (e.g., nonreactive) with the processing solution and semiconductor substrates. Further, the surfactant is preferably chosen to be close or compatible with the pH of the processing solution.

The surfactant used may be for example, anionic, nonionic, cationic, or amphoteric. If more than one surfactant is used, for example in the same or different processing solution, preferably the surfactants chosen are compatible (e.g., ionically) with each other. For example, if an anionic surfactant is used, preferably any other surfactant used in the same processing solution or in subsequent processing solutions will be anionic, nonionic, or amphoteric. If a cationic surfactant is desired, preferably any other surfactant used in the same processing solution or in subsequent processing solutions will be cationic, nonionic, or amphoteric. Preferably, all surfactants used in the processing solutions will have the same ionic charge, such as anionic. Preferably, the surfactants used in the present invention are nonionic or anionic.

Suitable surfactants for use in the present invention include for example any surfactant available to those skilled in the art. Suitable examples of anionic, nonionic, cationic and amphoteric surfactants are disclosed in for example Kirk-Othmer Concise Encyclopedia of Chemical Technology, published by John Wiley & Sons, NY, 1985, pages 1142 to 1144 and McCutcheon's Detergents and Emulsifiers, 1981 North American Edition, MC Publishing Company, Glen Rock, N.J. 1981, which are hereby incorporated by reference in their entireties. Preferred surfactants are VALTRON® surfactants such as VALTRON® SP2275, supplied by Valtech Corporation of Pughtown, Pa., and NCW601A supplied by Wako Company.

The surfactant is added in an amount sufficient to reduce the contact angle to less than 90°, preferably to less than 50°, more preferably less than 10°, and most preferably less than 5°. It is believed that the surfactant should preferably be added in an amount equal to or exceeding the critical micelle concentration for the surfactant, although concentrations below the critical micelle concentration may work as well. Preferably, the surfactant is added to provide a concentration of surfactant in the processing solution of at least 1.0 ppm, more preferably from about 1.0 ppm to about 50,000 ppm, and most preferably from about 10 ppm to about 5,000 ppm, based on the weight of the processing solution.

The surfactant may be added to the processing solution in any manner as long as the surfactant is present in a sufficient concentration that the contact angle is less than 90° during immersion of the semiconductor substrates. through the gas-liquid interface. For example, the surfactant may be added to a processing solution prior to placing the semiconductor substrates in the processing solution. Also, for example, the surfactant may be injected either alone or with other chemicals into a carrier fluid such as water to form a processing solution that is then directed into a process vessel. In the latter case, the semiconductor substrates may already be present in the vessel or be placed in the vessel after filling the vessel with the processing solution.

In the case of a Full-Flow™ styled vessel (described hereinafter) the surfactant may be delivered to the process vessel in many ways. For example, a carrier fluid, such as deionized water may be bled to a drain while the feed rate of surfactant is adjusted to obtain a desired concentration of the surfactant in the carrier fluid. Once the desired surfactant feed rate and concentration is reached in the carrier fluid, the carrier fluid containing the surfactant is then directed into the process vessel. In another embodiment, other chemicals may be injected into the carrier fluid in addition to the surfactant to form a treating solution. This treating solution is then directed into the process vessel. It is also possible to form a processing solution (including a treating or rinsing solution) by initially injecting the surfactant and any other desired chemicals into a carrier fluid, and then ceasing the injection of surfactant while maintaining the injection rate of other chemicals and the flow of the carrier fluid. The injection of surfactant can be ceased as just described as long as the contact angle is reduced to less than 90° during immersion. Preferably though, the injection of surfactant is maintained the entire time a gas-liquid interface of a processing solution is directed into the process vessel.

Also, it is preferred that the processing solution is added in a manner that the surfactant is contacted substantially uniformly with the semiconductor substrates. To ensure uniform contact of the surfactant with the semiconductor substrates, the flow of the processing solution preferably approaches, or comes as close as possible to plug flow under laminar flow conditions. Under conditions approaching plug flow, the method for forming a processing solution by initially injecting the surfactant and any other desired chemicals into a carrier fluid, and then ceasing the injection of surfactant while maintaining the flow of the other processing solution components as previously described can be more readily carried out.

Other suitable methods and systems of injecting surfactant or other chemicals into a process vessel are described in for example U.S. Pat. Nos. 4,778,532; 4,917,123; 4,795,497; and 4,899,767, which are hereby incorporated by reference in their entireties.

Preferably, wet processing in accordance with the methods of the present invention will include contacting the semiconductor substrates with at least one treating solution (i.e., chemically reactive solution) or at least one rinsing solution. Thus, in any treating solution or rinsing solution having a gas-liquid interface that the semiconductor substrates are exposed to during immersion, a surfactant is added in accordance with the present invention to reduce particle contamination of the semiconductor substrates. For example, in a typical multiple bath system, the semiconductor substrates are immersed in a plurality of baths where each bath contains a processing solution, and each processing solution has a gas-liquid interface. In this type of system, a surfactant would be added to each of the processing solutions (including rinsing solutions) since each processing solution has a gas-liquid interface that the semiconductor substrates are contacted with during immersion. In a single vessel system, each processing solution may not necessarily need a surfactant depending on whether the processing solution has a gas-liquid interface that the semiconductor substrates are exposed to during immersion. For example, where the processing solution is removed from the vessel such that the semiconductor substrates are again exposed to the gas atmosphere in the vessel, the semiconductor substrates will be exposed to a gas-liquid interface during immersion with the next processing solution. Therefore a surfactant would be added to this next processing solution introduced into the vessel. However, if a processing solution in a vessel is directly displaced by the next processing solution without exposing the semiconductor substrates to a gas-liquid interface, then no surfactant is needed in the next processing solution. An example of a single vessel system where a processing solution may be directly displaced by the next processing solution is a Full-Flow™ system as previously described. In a Full-Flow™ type system (discussed in more detail hereinafter) it is possible that the semiconductor substrates will be exposed to only one gas-liquid interface. This exposure to a gas-liquid interface occurs during the initial immersion of the semiconductor substrates with the first or initial processing solution.

Examples of treating solutions that the semiconductor substrates may be contacted with during wet processing include for example cleaning solutions, etching solutions, or solutions to remove photoresists. These solutions contain chemically reactive substances to achieve the desired treatment. For example, cleaning solutions typically contain one or more corrosive agent such as an acid or base. Suitable acids for cleaning include for example sulfuric acid, hydrochloric acid, nitric acid, or aqua regia. Suitable bases include for example, ammonium hydroxide. The desired concentration of the corrosive agent in the cleaning solution will depend upon the particular corrosive agent chosen and the desired amount of cleaning. These corrosive agents may also be used with oxidizing agents such as ozone or hydrogen peroxide. Preferred cleaning solutions are "SC1" solutions containing water, ammonia, and hydrogen peroxide, and "SC2" solutions containing water, hydrogen peroxide, and hydrochloric acid. Typical concentrations for SC1 solutions range from about 5:1:1 to about 200:1:1 parts by weight $H_2O$: $H_2O_2$: $NH_4OH$. Typical concentrations for SC2 solutions range from about 5:1:1 to about 1000:0:1 parts by weight $H_2O$: $H_2O_2$:HCl. Suitable etching solutions contain agents that are capable of removing oxides. A common etching agent used is for example hydrofluoric acid, buffered hydrofluoric acid, ammonium fluoride, or other substances which generate hydrofluoric acid in solution. A hydrofluoric acid containing etching solution may contain for example from about 4:1 to about 1000:1 parts by weight $H_2O$ :HF. Solutions used to remove photoresist include for example solutions containing sulfuric acid, and an oxidizing substance such as hydrogen peroxide, ozone or combinations thereof. One skilled in the art will recognize that there are various treating solutions that can be used during wet processing. Other examples of treating solutions that can be used during wet processing are disclosed in "Chemical Etching" by Werner Kern et al., in Thin Film Processes, edited by John L. Vossen et al., published by Academic Press, NY 1978, pages 401–496, which is incorporated by reference in its entirety.

Following contact with one or more treating solutions, preferably, the semiconductor substrates are rinsed with one or more rinsing solutions to remove residual treating solution, particles or combinations thereof. Any rinsing solution may be chosen that is effective in removing the treating solution from the semiconductor substrates. In selecting a rinsing solution such factors as the nature of the surfaces of the semiconductor substrates to be rinsed, the nature of contaminants dissolved in the treating solution, and the nature of treating solution to be rinsed should be considered. Also, the proposed rinsing solution should be compatible (i.e., nonreactive) with the materials of construction in contact with the rinsing solution. Rinsing solutions which may be used include for example water, organic solvents, mixtures of organic solvents, ozonated water, or combinations thereof. Preferred organic solvents include those organic compounds useful as drying solutions disclosed herein after such as $C_1$ to $C_{10}$ alcohols, and preferably $C_1$ to $C_6$ alcohols. Preferably the rinsing solution is deionized water. Rinsing solutions may optionally contain low levels of chemically reactive substances to enhance rinsing.

One skilled in the art will recognize that the type and sequence of wet processing will depend upon the desired treatment. For example, the semiconductor substrates could be contacted with an SC1 solution, rinsed with deionized water, contacted with an etching solution, and rinsed with deionized water. Another example of wet processing could include contacting the semiconductor substrates with a sulfuric acid/hydrogen peroxide solution and rinsing with deionized water. A preferred wet processing method contacts the semiconductor substrates with an SC1 solution only, or contacts the semiconductor substrates with a rinsing solution first, followed by an SC1 solution prior to drying. Thus there are various types of ways in which the semiconductor substrates could be wet processed in accordance with the method of the present invention.

The methods of the invention may be carried out in generally any wet processing equipment including for example, Full Flow™ systems, multiple bath systems (e.g., wet bench), and single vessel systems. See, e.g., Chapter 1: Overview and Evolution of Semiconductor Wafer Contamination and Cleaning Technology by Werner Kern and Chapter 3: Aqueous Cleaning Processes by Don C. Burkman, Donald Deal, Donald C. Grant, and Charlie A. Peterson in Handbook of Semiconductor Wafer Cleaning Technology (edited by Werner Kern, Published by Noyes Publication Parkridge, N.J. 1993), and Wet Etch Cleaning by Hiroyuki Horiki and Takao Nakazawa in Ultraclean Technology Handbook, Volume 1, (edited by Tadahiro Ohmi published by Marcel Dekker), the disclosures of which are herein incorporated by reference in their entirety.

In a preferred embodiment of the invention, the semiconductor substrates are housed in a single vessel system. Preferably single vessel systems such as those disclosed in U.S. Pat. Nos. 4,778,532, 4,917,123, 4,911,761, 4,795,497, 4,899,767, 4,984,597, 4,633,893, 4,917,123, 4,738,272, 4,577,650, 5,571,337 and 5,569,330, the disclosures of which are herein incorporated by reference in their entirety, are used. Preferred commercially available single vessel systems are Full-Flow™ vessels such as those manufactured by CFM Technologies, Poiseidon manufactured by Steag, and 820FL manufactured by Dainippon Screen. Such systems are preferred because it is possible to minimize the number of gas-liquid interfaces that the semiconductor substrate are exposed to by directly displacing a processing solution in the vessel with the next processing solution (including rinsing solutions).

Following wet processing with treating or rinsing solutions, the semiconductor substrates are preferably dried. By "dry" or "drying" it is meant that the semiconductor substrates are preferably made substantially free of liquid droplets. By removing liquid droplets during drying, impurities present in the liquid droplets do not remain on the surfaces of the semiconductor substrates when the liquid droplets evaporate. Such impurities undesirably leave marks (e.g., watermarks) or other residues on the surfaces of the semiconductor substrates. However, it is also contemplated that drying may simply involve removing a treating, rinsing solution, or drying solution, for example with the aid of a drying solution or drying fluid stream, or by other means known to those skilled in the art.

Any method and system of drying may be used. Suitable methods of drying include for example evaporation, centrifugal force in a spin-rinser-dryer, steam or chemical drying, or combinations thereof.

A preferred method of drying uses a drying fluid stream to directly displace the last processing solution that the semiconductor substrates are contacted with prior to drying (hereinafter referred to as "direct displace drying"). Suitable methods and systems for direct displace drying are disclosed in for example U.S. Pat. Nos. 4,778,532, 4,795,497, 4,911, 761, 4,984,597, 5,571,337, and 5,569,330. Other direct displace dryers that can be used include Marangoni type dryers supplied by manufacturers such as Steag, Dainippon, and YieldUp. Most preferably, the system and method of U.S. Pat. No. 4,7911,761 is used for drying the semiconductor substrates.

Figure 6B:
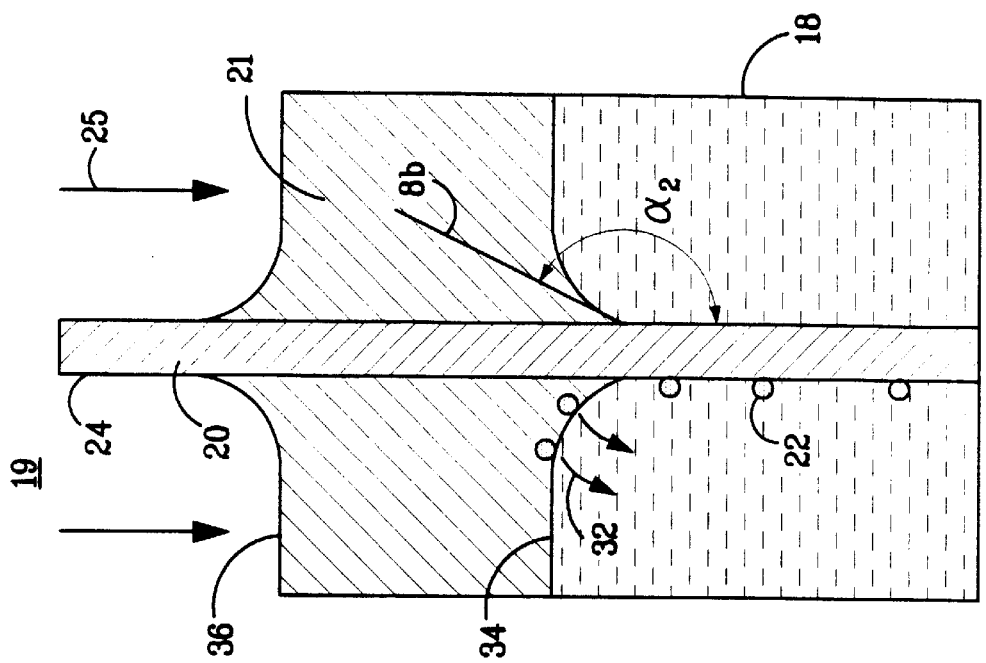
FIG. 6B is a schematic drawing showing the effect of a drying fluid stream in removing or inhibiting particles from depositing on a semiconductor substrate during removal of the semiconductor substrate from a liquid.
Figure 6A:
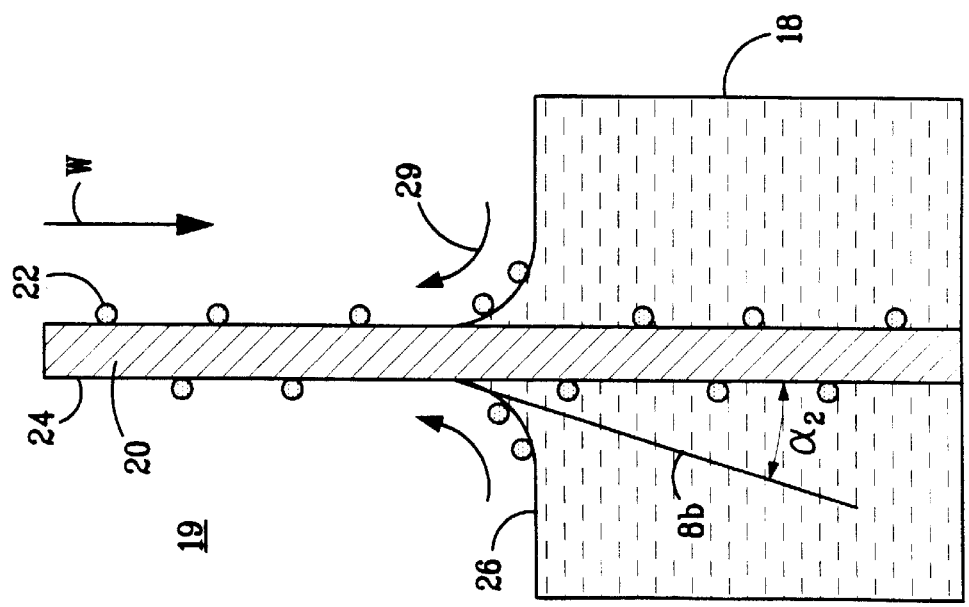
FIG. 6A is a schematic drawing showing the deposition of particles onto a semiconductor substrate during withdrawal.

One reason that direct displace drying is preferred for use in the present invention is that it is believed that particle contamination can be further reduced by this type of drying. Although in no way intending to be limited by theory, FIGS. 6A and 6B schematically show models for particle deposition and particle removal, respectively during removal of a semiconductor substrate from a liquid. In FIG. 6A, a semiconductor substrate 20 is being removed from a liquid 18 in a direction W. The contact angle $\alpha_2$ shown between tangent line 8b and substrate surface 24 is less than 90° during withdrawal. As shown in FIG. 6A, the less than 90° contact angle $\alpha_2$ causes particles 22 at the gas-liquid interface 26 to be plied towards the substrate surface 24 in the direction of arrows 29. From FIG. 6A, it appears that the contact angle $\alpha_2$ should be altered to be greater than 90° to reduce particle adhesion to substrate surface 24 during withdrawal. However, increasing the contact angle $\alpha_2$ during withdrawal can be difficult.

Although in no way intending to be limited in theory, it is believed that direct displace drying with a suitable drying fluid stream can alter contact angle $\alpha_2$ to be greater than 90°. For example, FIG. 6B shows a drying fluid stream 21 such as isopropanol vapor being directed downward in a direction 25 to displace liquid 18, such as an aqueous solution. A gas 19, such as air, is located above drying fluid stream 21 and forms a gas-drying fluid interface 36 with drying fluid stream 21. The drying fluid stream 21 also forms a drying fluid-liquid interface 34 with liquid 18. The drying fluid-liquid interface 34 is different from gas-liquid interface 26 in FIG. 6A in that drying fluid stream 21 has a greater attraction to the semiconductor substrate in comparison to liquid 18. As a result, the contact angle $\alpha_2$ between the drying fluid-liquid interface 34 is altered so that the drying fluid stream 21 has greater contact with the substrate surface 24 relative to the liquid 18 at the drying fluid-liquid interface 34. This results in the contact angle a2 between the liquid, drying fluid stream, and semiconductor substrate 20 being greater than 90°. The particles at the drying fluid-liquid interface 34 are thus drawn away from the semiconductor substrate 20 in a direction 32.

Preferably, the drying fluid stream is formed from a partially or completely vaporized drying solution. The drying fluid stream may be for example superheated, a mixture of vapor and liquid, or saturated vapor.

The drying solution stream is preferably miscible with the last processing solution in the vessel and non-reactive with the surfaces of the semiconductor substrates. The drying solution also preferably has a relatively low boiling point to facilitate drying. For example, the drying solution is preferably selected from organic compounds having a boiling point of less than about 140 degrees centigrade at atmospheric pressure. Examples of drying solutions which may be employed are steam, alcohols such as methanol, ethanol, 1-propanol, isopropanol, n-butanol, secbutanol, tertbutanol, or tert-amyl alcohol, acetone, acetonitrile, hexafluoroacetone, nitromethane, acetic acid, propionic acid, ethylene glycol mono-methyl ether, difluoroethane, ethyl acetate, isopropyl acetate, 1,1,2-trichloro-1,2,2-trifluoroethane, 1,2-dichloroethane, trichloroethane, perfluoro-2-butyltetrahydrofuran, perfluoro-1,4-dimethylcyclohexane or combinations thereof Preferably, the drying solution is a $C_1$ to $C_6$ alcohol, such as for example methanol, ethanol, 1-propanol, isopropanol, n-butanol, secbutanol, tertbutanol, tert-amyl alcohol, pentanol, hexanol or combinations thereof.

In a preferred embodiment of the present invention a drying solution is selected which is miscible with the processing solution present in the process vessel immediately before drying and forms a minimum-boiling azeotrope with the processing solution. Since water is the most convenient and commonly used solvent for treating or rinsing solutions, a drying solution which forms a minimum-boiling azeotrope with water is especially preferred.

In a preferred embodiment of the present invention, the semiconductor substrates are first exposed to a gas-liquid interface where the liquid is a rinsing solution containing a surfactant (hereinafter referred to as a "conditioning solution"). Particularly, in this embodiment, the first processing solution that the wafers are exposed to is a rinsing solution having a surfactant. By having the semiconductor substrates first exposed to a rinsing solution having a surfactant, the surfaces of the semiconductor substrates become surrounded with the surfactant. Although in no way intending to be bound in theory, it is believed that this covering of surfactant provides a barrier (either electrochemical or physical) to particles depositing on the surfaces of the semiconductor substrates.

Subsequent to contact with this conditioning solution, the semiconductor substrates may be treated as desired to prepare the semiconductor substrates for subsequent processing steps, for example as previously described. For example, the substrates are wet processed in an enclosable wet processing system to reduce the exposure of the substrates to oxygen, thus minimizing the risk of reoxidation once the surfaces of the substrates are cleaned. The enclosable wet processing system is also preferably capable of receiving different process fluids in various sequences. A preferred method of delivering process fluids to the substrates is by direct displacement of one fluid with another. The Full Flow™ wet processing system manufactured by CFM Technologies, Inc is an example of a system capable of delivering fluids by direct displacement. Following wet processing, the semiconductor substrates are preferably dried as previously described.

In other embodiments of the present invention, it may be desired that the initial processing solution that is contacted with the semiconductor substrates is a treating solution. This wet processing sequence is referred to as a "dry-start." In a dry start wet processing sequence, a preferred initial treating solution is an SC1 solution as previously described. In another preferred dry start wet processing sequence, it is preferred that the only treating solution contacted with the semiconductor substrates is an SC1 solution.

In another preferred embodiment of the present invention, the number of gas-liquid interfaces that the semiconductor substrates are exposed to is reduced to just one to further inhibit particle contamination of the semiconductor substrates during wet processing. This single exposure to a gas-liquid interface occurs during the immersion of the semiconductor substrates with the first or initial processing solution. Subsequent processing solutions are then introduced by directly displacing the processing solution in the process vessel with the next processing solution. The last processing solution in the vessel prior to drying is then displaced with a stream of partially or completely vaporized liquid (drying fluid stream) as previously described. The drying fluid stream may be for example superheated, a mixture of vapor and liquid, or saturated vapor. Thus, contact of the semiconductor substrates with a gas-liquid interface is avoided except for the initial processing solution that is used to immerse the semiconductor substrates.

The process vessel to carry out this preferred embodiment is any process vessel that is adapted to hold the semiconductor substrates and is capable of receiving different processing solutions in various sequences through direct displacement of one fluid with another. The process vessel should also preferably be capable of becoming hydraulically full or completely filled with process fluid during operation. For example, the process vessel is preferably designed so that gases from the atmosphere are not trapped within the vessel during operation. Also preferably, the process vessel is designed so that when process fluids are changed during the course of treating the wafers, residual prior process fluid is not significantly trapped within the process vessel for a significant period of time once the flow of the next process fluid is initiated. A preferred vessel is a Full Flow™ vessel previously described herein. Other wet processing vessels that can be used include Poiseidon manufactured by Steag, and 820FL manufactured by Dainippon Screen.

The initial processing solution that the semiconductor substrates are exposed to in this preferred embodiment may be a conditioning solution as previously described herein or a treating solution (i.e., chemically reactive solution). This initial solution also contains a surfactant and is added in accordance with the methods previously described. For example, with respect to a Full-Flow type system, the surfactant may be injected into a carrier fluid such as deionized water to form an initial processing solution that is then directed into the process vessel. Also for example, the surfactant may be injected with other chemicals into the carrier fluid to form an initial solution that is a treating solution. It is also possible to form a processing solution (including a treating or rinsing solution) by initially injecting the surfactant and any other desired chemicals into the carrier fluid, and then ceasing the injection of surfactant while maintaining the injection rate of other chemicals and the flow of the carrier fluid. The injection of surfactant can be ceased as just described as long as the contact angle is reduced to less than 90° during immersion. It is preferred however to inject the surfactant the entire time a gas-liquid interface of a processing solution is directed into the process vessel.

Following introduction of the initial processing solution, additional treating or rinsing solutions may be introduced by directly displacing the initial processing solution with the next desired processing solution. The last processing solution in the process vessel is directly displaced with a drying fluid stream as previously described. The drying fluid stream displaces the last processing solution at a rate such that preferably substantially no liquid droplets remain on the semiconductor substrates. Suitable systems and method for drying are disclosed in U.S. Pat. Nos. 4,778,532, 4,795,497, 4,911,761, and 4,984,597 with the systems and methods disclosed in U.S. Pat. No. 4,911,761 being preferred. Other direct displace dryers that can be used include Marangoni type dryers supplied by manufacturers such as Steag, Dainippon, and YieldUp.

The semiconductor substrates obtained using the methods of the present invention preferably are substantially free of particle contamination. By "substantially free" it is meant that the semiconductor substrates contain preferably less than 0.05 particles per cm², and more preferably less than 0.016 particles per cm². The particle size of particles remaining on the semiconductor substrate is preferably equal to or less than 0.3 µm and more preferably less than 0.12 µm in diameter as measured by KLA Tencor SP1 particle scanning equipment. Preferably all particles greater than 0.3 µm are removed using the methods of the present invention.

EXAMPLES

A method of the present invention was used to treat silicon wafers to reduce particle contamination during wet processing. The silicon wafers in all Examples were treated in an enclosed Full-Flow™ 8100 Wet Processing System manufactured by CFM Technologies, Inc. The resulting wafers were then analyzed for particles using a Tencor SP1 particle scanning equipment available from KLA Tencor.

Comparative Example 1

A Full-Flow™ process vessel fully loaded with silicon wafers was filled with an initial solution having a temperature of 30° C. and containing 1.3 parts by volume of a 28 wt % aqueous ammonium hydroxide solution, 2.2 parts by volume of a 30 wt % aqueous hydrogen peroxide solution and 100 parts by volume of deionized water. The process vessel was filled with this initial solution at a rate of 10 gallons per minute (gpm) over a period of 120 seconds. After filling the vessel, the initial solution was held in the process vessel for a period of 30 seconds.

the initial solution was then displaced with a rinsing solution of deionized water having a temperature of 42° C. The deionized water was introduced into the process vessel at a flow rate of 30 gpm for 60 seconds and then cycled to a flow rate of 12 gpm for 60 seconds. This cycling was repeated until the deionized water exiting the process vessel had a resistivity of 5mega-ohms. After reaching this resistivity, the flow of deionized water was continued to be cycled through the process vessel for an additional minute. The total rinsing time was greater than 5 minutes.

Following the rinse, the wafers were dried with a drying fluid stream of isopropanol vapor. The isopropanol vapor was directed through the process vessel at a pressure of 1.5 psig for 8 minutes.

Four more batches of wafers were processed in the manner described above for a total of 5 runs.

Three wafers from each batch of wafers were then analyzed for particle contamination for particles ranging in size from 0.16 µm to 1.0 µm. The results are shown in Comparative Table 1:

Comparative Table 1

| Run | Avg. LPD Count[1] | | |
|---|---|---|---|
| | Pre | Post | Delta |
| 1 | 27 | 25.3 | −1.7 |
| 2 | 9 | 10.67 | +1.67 |
| 3 | 10.67 | 27.3 | +16.6 |
| 4 | 27.3 | 16.3 | −11 |
| 5 | 16.3 | 27 | +10.7 |
| Average | 18.05 | 21.31 | +3.25 |

[1]Average Light Point Defect Count

The data in Comparative Table 1 reports the average number of particles per wafer detected on the three wafers. The "Pre" column reports the average number particles per wafer prior to wet processing, the "Post" column reports the average number of particles after wet processing, and the "Delta" column reports the average change in particles per wafer between "Pre" and "Post" wet processing. A negative "Delta" means that particles were removed during wet processing. Thus, the wet processing in Comparative Table 1 resulted in an average increase of 3.25 particles being deposited per wafer.

Example 2

A Full-Flow™ process vessel fully loaded with silicon wafers was filled with an initial solution having a temperature of 30° C. and containing 1 part by volume VALTRON® SP2275, 1.3 parts by volume of a 28 wt % aqueous ammonium hydroxide solution, 2.2 parts by volume of a 30 wt % aqueous hydrogen peroxide solution and 100 parts by volume of deionized water. The process vessel was filled with this initial solution at a rate of 10 gallons per minute (gpm) over a period of 120 seconds. After filling the vessel, the initial solution was held in the process vessel for a period of 30 seconds.

The initial solution was then displaced with a rinsing solution of deionized water having a temperature of 42° C. The deionized water was introduced into the process vessel at a flow rate of 30 gpm for 60 seconds and then cycled to a flow rate of 12 gpm for 60 seconds. This cycling was repeated until the deionized water exiting the process vessel had a resistivity of 5 mega-ohms. After reaching this resistivity, the flow of deionized water was continued to be cycled through the process vessel for an additional minute. The total rinsing time was greater than 5 minutes.

Following the rinse, the wafers were dried with a drying fluid stream of isopropanol vapor. The isopropanol vapor was directed through the process vessel at a pressure of 1.5 psig for 8 minutes.

Ten more batches of wafers were processed in the manner described above for a total of 11 runs.

Three wafers from each batch of wafers were then analyzed for particle contamination for particles ranging in size from 0.16 µm to 1.0 µm. The results are shown in Table 2:

TABLE 2

| | Conditions | | Avg. LPD Count | | |
|---|---|---|---|---|---|
| Run | Temp (° C.) | Injection (seconds) Seconds | Pre | Post | Delta |
| 1 | 30 | 60 | 30.3 | 10.6 | −19.7 |
| 2 | 60 | 60 | 10.6 | 18 | +7.33 |
| 3 | 60 | 60 | 18 | 19.6 | +1.67 |
| 4 | 60 | 120 | 24 | 21.7 | −2.33 |
| 5 | 60 | 120 | 21.7 | 13.7 | −8 |
| 6 | 30 | 120 | 13.7 | 7.3 | −6.33 |
| 7 | 33 | 120 | 2.33 | 7 | +4.67 |
| 8 | 30 | 120 | 0.3 | 7.6 | +7.33 |
| 9 | 38 | 120 | 7 | 6.67 | −0.33 |
| 10 | 30 | 120 | 7.67 | 2.67 | −5 |
| 11 | 29 | 120 | 6.67 | 0.67 | −6 |
| Avg. | — | — | 12.93 | 10.50 | −2.43 |

In Table 2, the "Pre", "Post" and "Delta" columns have the same meaning as in Comparative Table 2. The "Conditions" column reports the temperature and injection time of the initial solution.

The data in Table 2 demonstrates that the methods of the present invention are effective in reducing particle contamination during wet processing of semiconductor substrates. For example, the addition of a surfactant to the initial processing solution resulted, on average, in a decrease of 2.43 particles per wafer. In comparison, when using no surfactant in the initial processing solution, Comparative Table 1 shows that there was an increase on average in particles of about 3.25 particles per wafer.

This difference in results between Comparative Table 1 and Table 2 is especially significant when considering that the wafers in Comparative Table 2 contained more particles per wafer on average (18.05) in comparison to Table 2 (12.93) prior to processing. One skilled in the art would expect that the particles in Table 2 would be more difficult to remove from the wafers in comparison to the wafers in Comparative Table 1, since there are less particles to remove in the wafers of Table 2. It is unexpected that the addition of a surfactant in accordance with the methods of the present invention could have this significant effect on reducing particle contamination.

Although the present invention has been described above with respect to particular preferred embodiments, it will be apparent to those skilled in the art that numerous modifications and variations can be made to those designs. The descriptions provided are for illustrative purposes and are not intended to limit the invention.

What is claimed is:

1. A method for reducing particle contamination of semiconductor substrates during wet processing consisting of:
   (a) initially contacting the semiconductor substrates with an initial liquid processing solution having a first gas-liquid interface and comprising at least one first surfactant, wherein the semiconductor substrates are contacted with the first gas-liquid interface; and
   (b) contacting the semiconductor substrates with one or more subsequent processing solutions, wherein all subsequent processing solutions that contact the semiconductor substrate in the presence of a gas comprise at least one second surfactant that provides a dynamic contact angle of less than about 90°.

2. The method of claim 1 wherein the surfactant is nonionic, anionic, cationic, or amphoteric.

3. The method of claim 2 wherein the surfactant is nonionic.

4. The method of claim 1 wherein the concentration of the surfactant in the processing solution is at least 1 ppm.

5. The method of claim 1 wherein the wafers are processed in one or more vessels.

6. The method of claim 1 wherein the semiconductor substrates are processed in a single vessel.

7. The method of claim 1 wherein the initial liquid processing solution is a rinsing solution.

8. The method of claim 7 wherein at least one of the subsequent processing solutions is a chemically reactive processing solution.

9. The method of claim 1 further comprising the step of drying the semiconductor substrates.

10. The method of claim 1 wherein the first surfactant and the second surfactant are the same.

11. A method for reducing particle contamination of semiconductor substrates during wet processing comprising:
    (a) immersing the semiconductor substrates in an initial liquid processing solution comprising at least one surfactant and having a gas-liquid interface, wherein the semiconductor substrates are contacted with the gas-liquid interface during the immersing;
    (b) contacting the semiconductor substrates with one or more processing solutions to process the semiconductor substrates wherein during the processing, the semiconductor substrates are exposed to no other gas-liquid interfaces, except for the gas-liquid interface of the initial liquid processing solution, and;
    (c) removing the last processing solution in contact with the semiconductor substrates by displacing the last processing solution with a drying fluid stream.

12. The method of claim 11 wherein the surfactant is nonionic, anionic, cationic, or amphoteric.

13. The method of claim 12 wherein the surfactant is nonionic.

14. The method of claim 11 wherein the concentration of the surfactant in the initial solution is at least 1 ppm.

15. The method of claim 11 wherein the semiconductor substrates are immersed in the initial liquid processing solution by positioning the semiconductor substrates in a closable vessel and filling the vessel with the initial solution.

16. The method of claim 1 wherein the initial liquid processing solution is a rinsing solution.

17. The method of claim 1, wherein said semiconductor substrates are initially contacted with said initial processing solution by immersing said substrate in said initial processing solution and wherein said semiconductor substrates are contacted with said subsequent processing solutions by immersing said substrates in said subsequent solutions.

18. A method for reducing semiconductor substrate contamination from contaminants that reside at the surface of processing solutions consisting of:
    (a) contacting at least one semiconductor substrate with a first liquid processing solution in the presence of a gas, the first liquid processing solution comprising a surfactant, wherein the first processing solution has a gas-liquid interface; and
    (b) subsequently contacting the semiconductor substrate with at least one additional processing solution, wherein all additional liquid processing solutions that contact the semiconductor substrate in the presence of a gas comprise a surfactant and contact the semiconductor substrate at a dynamic contact angle of less than about 90°.

* * * * *

UNITED STATES PATENT AND TRADEMARK OFFICE
CERTIFICATE OF CORRECTION

PATENT NO.   : 6,517,636 B1    Page 1 of 1
DATED        : February 11, 2003
INVENTOR(S)  : Steven Verhaverbeke It is certified that error appears in the above-identified patent and that said Letters Patent is hereby corrected as shown below:

Column 12,
Line 48, "a2" should read -- $\alpha_2$ --

Signed and Sealed this

Ninth Day of September, 2003

JAMES E. ROGAN
*Director of the United States Patent and Trademark Office*